United States Patent
Klaassen

(10) Patent No.: US 7,403,147 B2
(45) Date of Patent: Jul. 22, 2008

(54) PRECISION CAPACITOR ARRAY

(75) Inventor: Erno H. Klaassen, Loa Altos, CA (US)

(73) Assignee: SiTime Corporation, Sunnyvale, CA (US)

( * ) Notice: Subject to any disclaimer, the term of this patent is extended or adjusted under 35 U.S.C. 154(b) by 0 days.

(21) Appl. No.: 11/606,681

(22) Filed: Nov. 29, 2006

(65) Prior Publication Data

US 2008/0122670 A1    May 29, 2008

(51) Int. Cl.
    *H03M 1/66*    (2006.01)
(52) U.S. Cl. .................................. 341/150; 341/144
(58) Field of Classification Search ............ 341/144, 341/155, 118, 120, 150
    See application file for complete search history.

(56) References Cited

U.S. PATENT DOCUMENTS

| | | | |
|---|---|---|---|
| 5,434,569 A | 7/1995 | Yung et al. | 341/172 |
| 5,583,359 A | 12/1996 | Ng et al. | 257/306 |
| 5,635,421 A | 6/1997 | Ting | 438/396 |
| 5,838,032 A | 11/1998 | Ting | 438/396 |
| 5,949,156 A | 9/1999 | Groover | 307/119 |
| 5,952,952 A | 9/1999 | Choi et al. | 341/172 |
| 5,973,633 A | 10/1999 | Hester | 341/172 |
| 6,016,019 A | 1/2000 | Wojewoda | 307/109 |
| 6,124,821 A | 9/2000 | Pezzini et al. | 341/161 |
| 6,496,131 B2 | 12/2002 | Yoshinaga | |
| 6,614,645 B1 | 9/2003 | Sakurai et al. | 361/328 |
| 6,747,522 B2 * | 6/2004 | Pietruszynski et al. | 331/177 R |
| 6,756,266 B2 | 6/2004 | Ping | 438/253 |
| 6,836,236 B2 * | 12/2004 | Horie | 341/155 |
| 6,969,680 B2 | 11/2005 | Paul et al. | |
| 6,982,454 B2 | 1/2006 | Giuroiu et al. | |
| 6,992,346 B2 | 1/2006 | Kim et al. | |
| 7,038,266 B2 | 5/2006 | Wang | |
| 7,113,052 B2 * | 9/2006 | Dunworth | 331/179 |
| 7,199,746 B1 * | 4/2007 | Chowdhury et al. | 341/172 |

* cited by examiner

*Primary Examiner*—Peguy JeanPierre
(74) *Attorney, Agent, or Firm*—Patterson & Sheridan, LLP

(57) ABSTRACT

A digital capacitor array with individually shielded unit capacitors and combination binary—thermometer coded addressing is disclosed. Such a capacitor array may be part of a digitally controlled oscillator in a MEMS-based frequency reference.

16 Claims, 12 Drawing Sheets

PRECISION CAPACITOR ARRAY

TECHNICAL FIELD

The invention relates generally to digital capacitor arrays. In particular it relates to digital capacitor array linearity, interconnection layout, shielding, and applications to micro-electromechanical systems (MEMS) frequency references.

BACKGROUND

A variable capacitance may be provided in a digital circuit by switching a number of equal unit capacitors into the circuit. In the simplest example, two unit capacitors connected in parallel provide a total capacitance equal to twice the unit capacitance. In general, N unit capacitors connected in parallel have a capacitance equal to N times the unit capacitance. Capacitances from zero up to the maximum capacitance of an array may be selected in steps as small as the unit capacitance.

Digitally selectable capacitance is useful in a variety of electronic circuits. For example, in a relaxation oscillator the frequency of the output depends on the time to charge a capacitor according to an RC time constant. Changing capacitance in the circuit changes the output frequency. Such oscillators are tunable over a wide range of output frequencies and consume low amounts of electrical power. Many other circuits, especially mixed analog—digital logic circuits, use digital capacitor arrays.

The resolution of a digital capacitor array can be defined as the minimum step in capacitance or the minimum difference between two output capacitance values. In theory, unit capacitors in a capacitor array could be made to have arbitrarily small capacitance leading to infinite precision. However, at least two effects limit the resolution that is achievable in practice. First, the unit capacitance cannot be smaller than stray or unintended capacitances. Second, it is challenging to make all unit capacitances in an array exactly equal to one another. The nominal unit capacitance must be greater than the variation in the unit capacitances of array elements.

The output capacitance of a digital capacitor array is selectable in steps corresponding to digital input values, for example, … n−1, n, n+1, … etc. If the output capacitance of a digital capacitor array always increases in response to an increase in the digital input value, then the array is said to be monotonic.

Ultimately, precision of a capacitor array and its monotonicity in response to digital input depend upon manufacturing tolerances and design. Capacitor arrays made in conjunction with other integrated circuits in a complementary metal-oxide-semiconductor (CMOS) process, for example, are subject to process variations in lithography, etch and other process modules. It is necessary to minimize the effects of these variations through innovation in unit capacitor design, array layout and digital addressing schemes.

BRIEF DESCRIPTION OF THE DRAWINGS

The drawings are heuristic for clarity.

DETAILED DESCRIPTION

Figure 1:
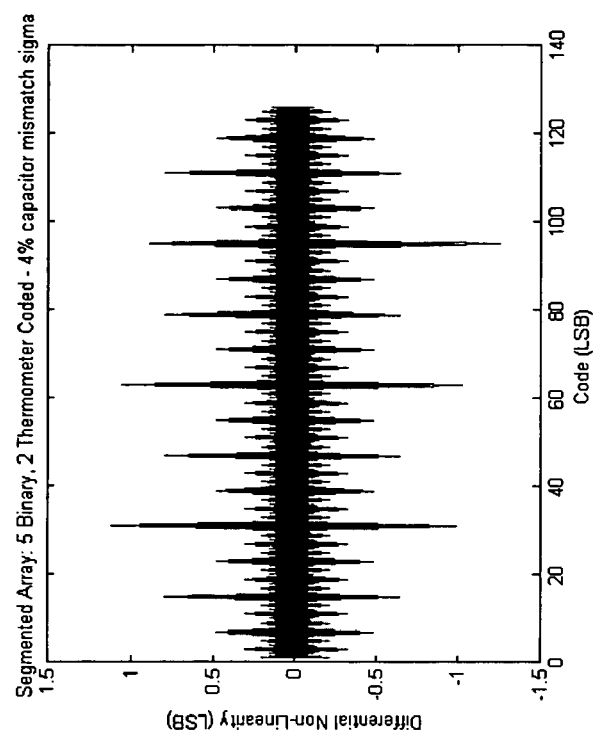
FIGS. 1A and B show differential nonlinearity of a capacitor array for different connection coding schemes.
Figure 1:
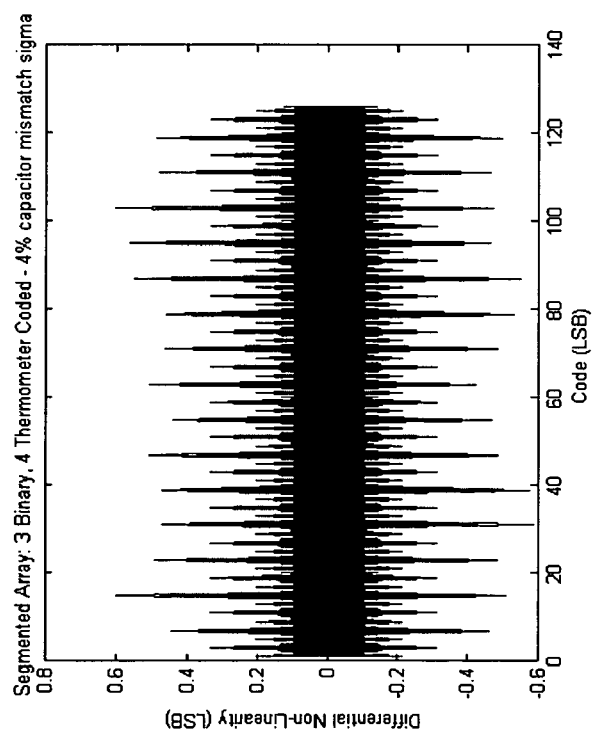

Process variations may have negative effects on the precision and monotonicity of digital capacitor arrays. For example, imperfect lithography may lead to variation in the nominal size of integrated capacitors thereby affecting their capacitance. Similarly, lack of attention to electrical shielding in a capacitor array design may lead to systematic unintended capacitances.

Consider a capacitor array providing $2^N$ capacitance steps. Each capacitor in the array has a nominal capacitance $C_0$, but an actual capacitance that may be different due to manufacturing process variations. Further assume that the variation of capacitances in the array is random and characterized by a normal distribution. The standard deviation of the distribution of capacitor values can be expressed as a percentage of the nominal value, $C_0$.

The capacitor array may be addressed with a binary weighted coding scheme to provide a variable capacitor with N bits of resolution. In such a scheme one capacitor represents the least significant bit, a set of two capacitors connected in parallel represents the next bit, and so on up to a set of $2^{N-1}$ capacitors representing the most significant bit. A desired capacitance is achieved by representing its value as a binary number and then connecting in parallel sets of capacitors corresponding to each bit in the binary number.

Alternatively the capacitor array may be addressed with a thermometer coding scheme. In such a scheme each capacitance step is achieved by connecting one additional capacitor group in parallel to those forming the previous capacitance.

Binary weighted coding and thermometer coding each have advantages. Generally, binary weighted arrays may be realized with fewer and simpler address lines compared to thermometer arrays. On the other hand, thermometer arrays are inherently monotonic. A trade off exists between these conditions.

The possibility that a binary weighted array has a non-monotonic transition from one capacitance value to another is greatest at a major code transition; for example a transition from 01111 to 10000. Ideally, 01111 represents a capacitance equal to 15 times $C_0$ while 10000 represents a capacitance equal to 16 times $C_0$. However, the accumulated random variations in the sets of capacitors representing each "ON" bit in 01111 may lead to a total capacitance that is greater than the capacitance of the set of capacitors representing the single "ON" bit in 10000.

A combination binary—thermometer coding scheme may be used to avoid non-monotonic transitions while keeping signal routing requirements practical. FIGS. 1A and B show differential nonlinearity of a capacitor array for different connection coding schemes. FIGS. 1A and B are graphs of differential non-linearity versus digital code for a capacitor array having $2^7$ possible capacitance outputs represented by codes ranging from 1 (binary: 0000001) to 128 (binary:

1000000). Differential non-linearity at each code step is the change in capacitance from the previous code to the present code, measured in units of the nominal unit capacitance. If the absolute value of the differential non-linearity is always less than one, then the array is monotonic. If the absolute value of the differential non-linearity is ever greater than one, then the array is not monotonic.

Differential non-linearity can also refer to the maximum difference between actual capacitance step size and nominal capacitance step size (measured in units of the nominal unit capacitance) over all the code steps in an array. Using this definition, an array is monotonic if the differential non-linearity is less than one.

The graphs of FIGS. 1A and B were generated by Monte Carlo simulation of arrays in which the standard deviation of the normal distribution of capacitor values in each array was 4% of the nominal unit capacitor value. In FIG. 1A results are presented for an array in which the three least significant bits are addressed with a binary weighted coding scheme while the four most significant bits are thermometer coded. In FIG. 1B the five least significant bits are addressed with a binary weighted coding scheme while the two most significant bits are thermometer coded.

The combination binary—thermometer coding scheme of FIG. 1B does not result in a monotonic array because the absolute value of the differential non-linearity exceeds one at transitions where the least significant bits "roll over" from x11111 to x100000; i.e. 31 to 32, 63 to 64, and 95 to 96. Less apparent initially, is that the combination binary—thermometer coding scheme of FIG. 1 A, while monotonic, is not optimal. In the case of FIG. 1 A, the number of binary weight coded bits is unnecessarily low and the number of thermometer coded bits is unnecessarily high to ensure monotonic transitions at every capacitance step. The price paid is that the layout of signal routing to an array of three binary and four thermometer coded bits is relatively complicated.

Figure 2:
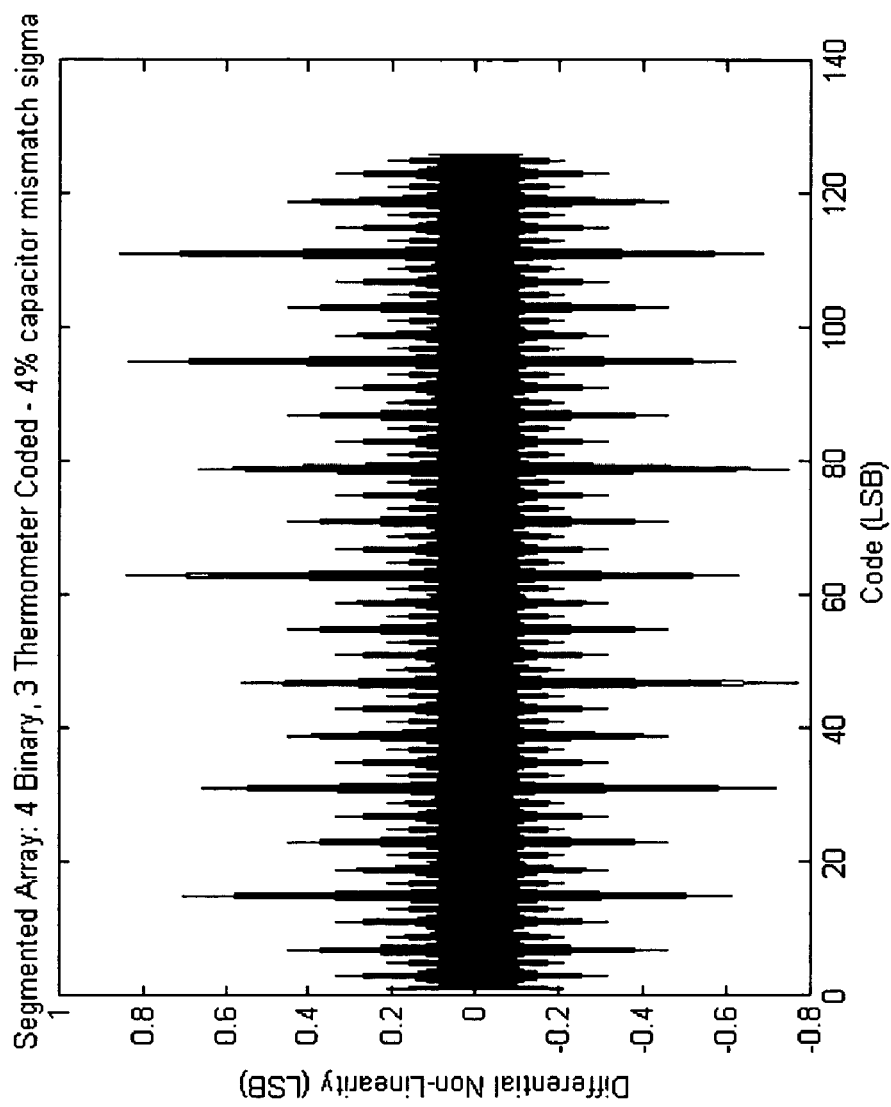
FIG. 2 shows differential nonlinearity of a capacitor array for a connection coding scheme.

FIG. 2 shows differential nonlinearity of a capacitor array for a connection coding scheme. Again, the standard deviation of the normal distribution of capacitor values in the array is 4% of the nominal unit capacitor value. Here, however, the four least significant bits are addressed with a binary weighted coding scheme while the three most significant bits are thermometer coded. The absolute value of differential nonlinearity never exceeds approximately 0.85. This combination binary—thermometer coding scheme is optimal for a seven bit array in the sense that it provides the simplest signal routing by having as many binary weighted bits as possible while still maintaining a strictly monotonic increase in capacitance versus code. A different segmentation between binary and thermometer coded bits might be optimal if the standard deviation of the capacitance distribution was significantly different from 4% and/or if the distribution was not a normal Gaussian distribution.

In general, a monotonic combination binary—thermometer coded addressing scheme may comprise M+N bits where M bits address M binary coded capacitor groups and N bits address $2^N$ thermometer coded capacitor groups. The capacitance of any single thermometer coded capacitor group must be greater than $(2^M-1)$ times the nominal capacitance of a unit capacitor and less than $(2^M+1)$ times the nominal capacitance of a unit capacitor.

Figure 3:
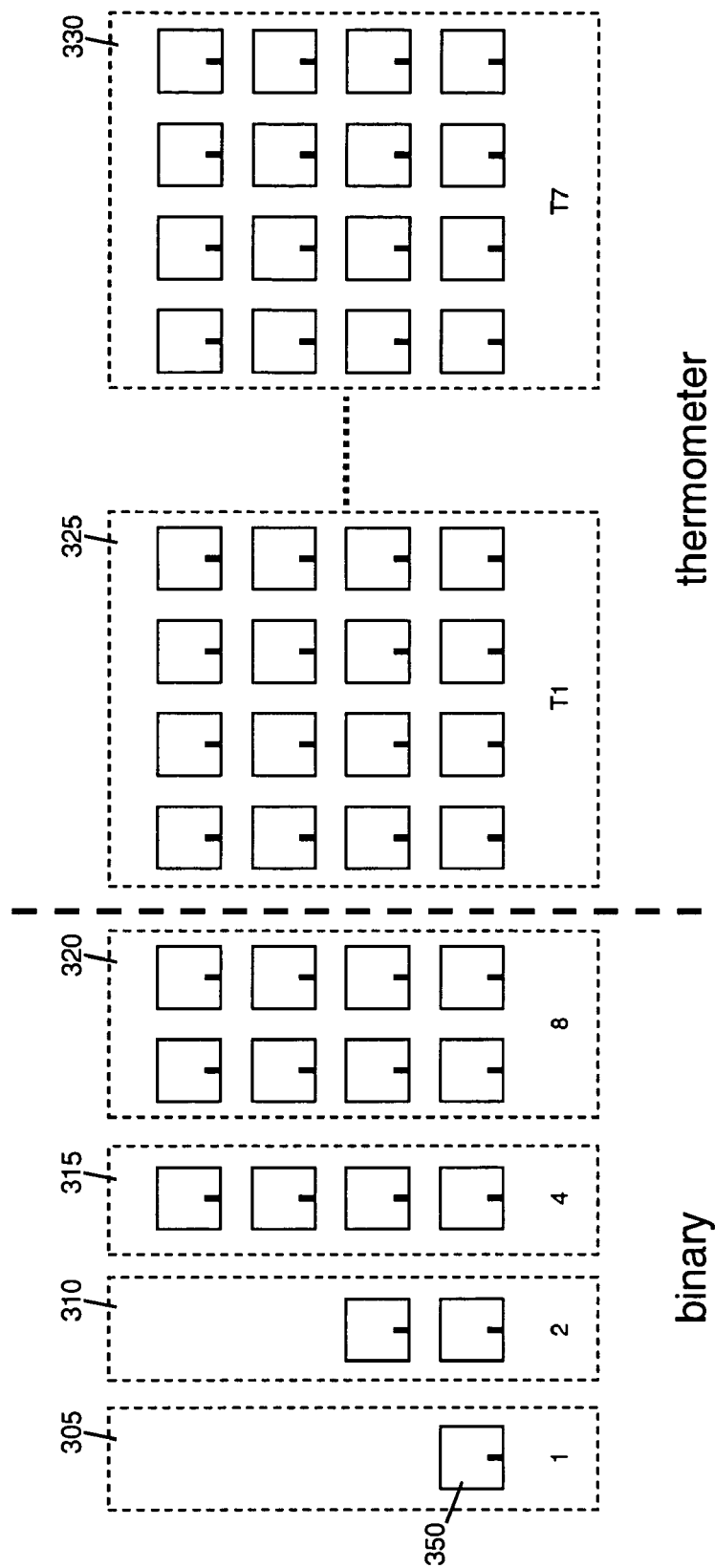
FIG. 3 shows a binary and thermometer coded capacitor layout.

FIG. 3 shows a binary and thermometer coded capacitor layout. In the figure individual capacitors are illustrated as shaded squares such as capacitor 350. Capacitors grouped within dotted outlines 305, 310, 315 and 320 form the binary coded section of the layout of FIG. 3 while those grouped within dotted outlines 325 and 330 (and other groups like them, not shown) form the thermometer coded section of the layout. Group 305 contains only one capacitor and therefore represents the $2^0$ bit of a binary capacitance code. Group 310 contains two capacitors and represents the $2^1$ bit of a binary capacitance code. Similarly groups 315 and 320 contain 4 and 8 capacitors and represent the $2^2$ and $2^3$ bits of a binary capacitance code, respectively. For example, to form a capacitance equal to five times the unit capacitance, capacitor groups 305 and 315 would be switched into a circuit while all other capacitor groups would be excluded. Capacitor groups 325 and 330 (and other groups like them, not shown) each contain the same number (16 in this example) of capacitors. Each time an additional thermometer coded capacitor group such as 325 is included in a circuit, the total capacitance increases by the same amount; in this case by sixteen times the unit capacitance.

If a capacitor array included only the thermometer coded groups of FIG. 3 its capacitance steps would be large and monotonic. Conversely if an array included only the binary coded groups of FIG. 3 it would be relatively simple to select any of sixteen possible capacitances with only four address lines. Process variations might lead to non-monotonic behavior at major code transitions, however. An array that combines both binary and thermometer coded sections strikes a balance between these two scenarios.

Figure 4:
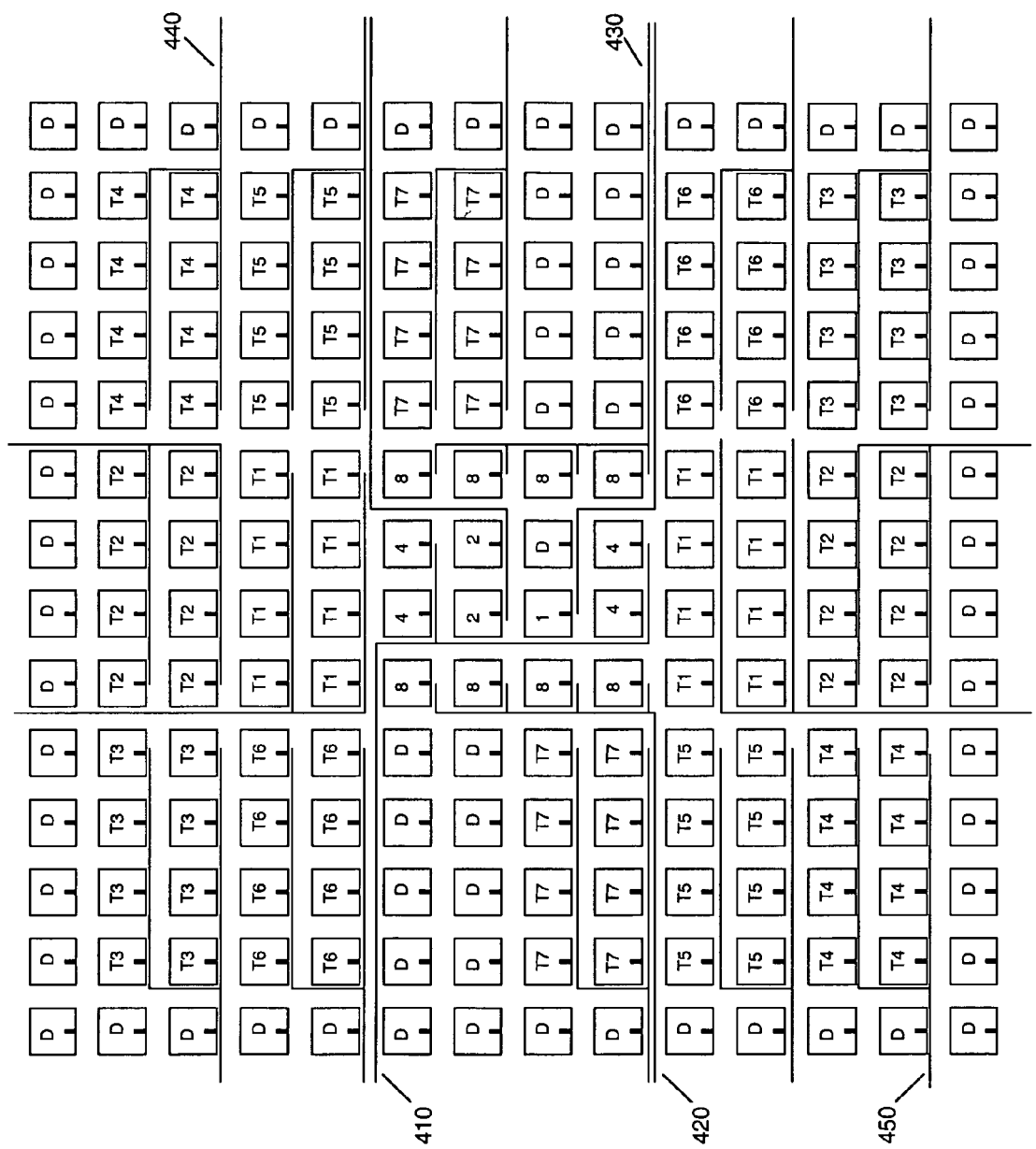
FIG. 4 shows a common-centroid capacitor array layout.

In integrated circuit manufacturing, process variations may be manifested as approximately linear gradients across dies in a wafer. An array of nominally identical capacitors may be manufactured as an array in which actual capacitance values increase linearly from one side of the die to the other. This effect can be at least partially mitigated by adopting a common-centroid layout as shown in FIG. 4. FIG. 4 shows a common-centroid capacitor array layout with both binary weighted and thermometer coded sections.

Figure 5:
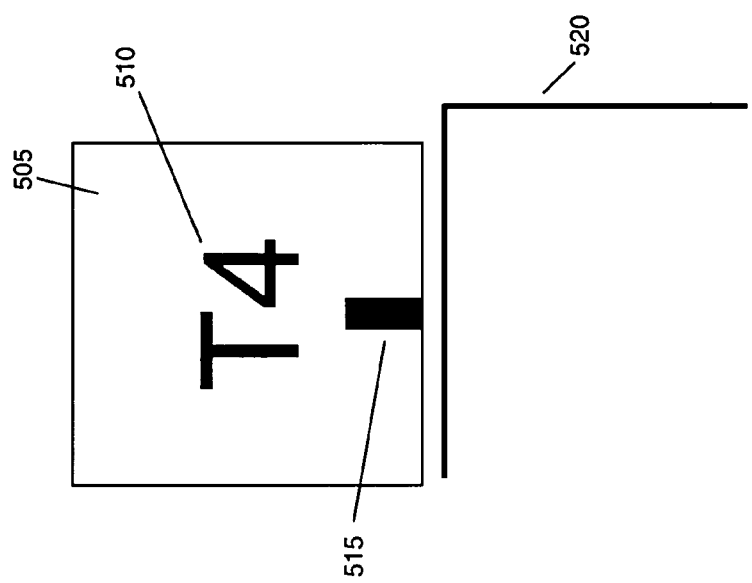
FIG. 5 shows a detail of part of the layout of FIG. 4.

The capacitors in the array of FIG. 4 are all nominally identical. Any variation between them is due to inevitable manufacturing imperfections. FIG. 5 shows a detail of part of the layout of FIG. 4. FIG. 5 is a schematic representation of a unit capacitor including the outline 505 of the capacitor, a label 510, a switch transistor 515 and an address line 520. Each capacitor in the array depicted in FIG. 4 has the outline, label and switch transistor shown in the example of FIG. 5, but some of them are not connected by address lines as will be explained shortly.

The capacitors in FIG. 4 are labeled by single numbers (e.g. "2", "8"), the letter "T" and a number (e.g. "T3", "T7"), or "D". Capacitors labeled by a unique single number are addressed as a group and form one bit of a binary coded section of the array. For example all of the capacitors labeled "4" are addressed by address line 410. The eight capacitors labeled "8" are addressed by address lines 420 and 430 which are connected together externally from the array. Capacitors labeled by the letter "T" and a number are addressed as a group and form one segment of a thermometer code. For example the sixteen capacitors labeled "T4" are addressed by address lines 440 and 450 which are connected together externally from the array. Finally capacitors labeled "D" are not connected to address lines. The "D" (dummy) capacitors, including all the capacitors along the outer edges of the array, exist to provide a consistent environment for other, connected capacitors in the array.

Whenever possible a group of capacitors, such as those labeled "8" or "T3", is split into two sub-groups that are arranged equidistant and on opposite sides from the center of the array. This is a so-called "common-centroid" layout. Suppose a process variation led to the capacitance of capacitors increasing from one side of the array to the other. In that case one sub-group in each group of capacitors would comprise capacitors of lower than average capacitance while the other would comprise capacitors of higher than average capacitance. Furthermore, given a linear process gradient, the variation below average for half a group cancels out the variation above average for the other half of the same group.

It can also be seen by inspection of FIG. 4 that only one process layer is required to address capacitors in the combination binary—thermometer coding scheme. The thermometer coded groups are closer to the edges of the array than are the binary coded groups so reaching them with address lines is simplified.

Figure 6:
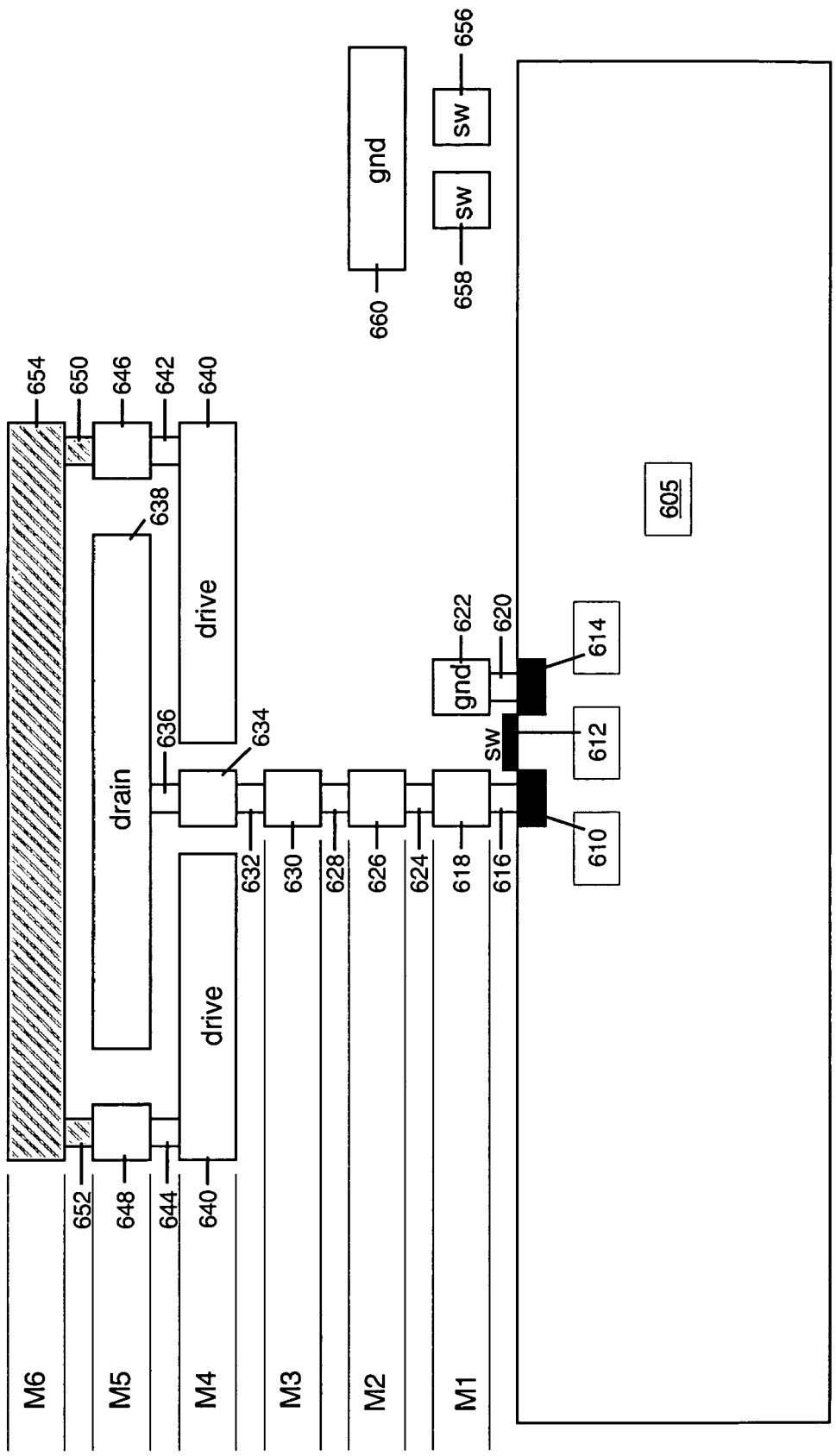
FIG. 6 shows a cross-section of a unit capacitor structure.

FIG. 6 shows a cross-section of a unit capacitor structure. FIG. 6 illustrates one way to implement a unit capacitor suitable for replication in an array of like capacitors by forming a structure in CMOS metal layers. However, suitable unit capacitors can be made with other semiconductor technologies or even non-integrated techniques. The unit capacitor in FIG. 6 is fabricated in six CMOS metal layers labeled M1-M6. In the figure, transistor wells 610 and 614, and transistor gate 612, are integrated with substrate 605. CMOS metal-1 regions include 618, 622, 658 and 656. CMOS metal-2 regions include 626 and 660. CMOS metal-3 regions include 630. CMOS metal-4 regions include 640 and 634. CMOS metal-5 regions include 648, 638 and 646. CMOS metal-6 regions include 654. Items 616, 620, 624, 628, 632, 636, 644, 642, 652, and 650 are via plugs that connect metal layers. Items 652, 654 and 650 are optional as described below.

The working capacitance of the unit capacitor shown in FIG. 6 is between the "drive" 640 and "drain" 638 metal regions. A hole in the drive plate allows connection from below to the drain plate. It is useful to minimize the capacitance between the drain plate and other features. This is achieved by shielding the sides of the drain plate with raised sections 648 and 646 on the outside of the drain plate. These shielding structures are connected by via plugs 644 and 642 to the drive plate 640.

The drain plate 638 is connected (by via—metal stack 636, 634, 632, 630, 628, 626, 624, 618, and 616) to a transistor switch (wells 610 and 614 with gate 612) through a hole in the drive plate. The hole is the open area in drive plate 640 within which metal connection 634 lies. The gate of the switch is connected to a signal line. Signal lines for adjacent cells, such as signal lines 658 and 656, are shielded by ground plate 660.

The only exposed section of the drain plate is the vertical connection formed by a via—metal stack, but this connection is separated from other signals by at least several micrometers. Additional shielding, using metal connected to the drive plate, could be placed around the vertical drain plate connection to further reduce coupling to the drain plate. Plate 654 connected to the drive plate by via plugs 652 and 650 is an optional structure that provides further shielding of the drain plate. Optional plate 654 further isolates individual capacitors from external influences such as could be encountered if an array were embedded with additional components above (i.e. farther away from substrate 605 than) it.

The capacitor shown in FIG. 6 is implemented in CMOS metal layers 4 and 5 with optional additional shielding from structures in metal layer 6. However, it would also be possible to use other metal layers, e.g. layers 3 and 4, to create the capacitor plates.

Figure 7:
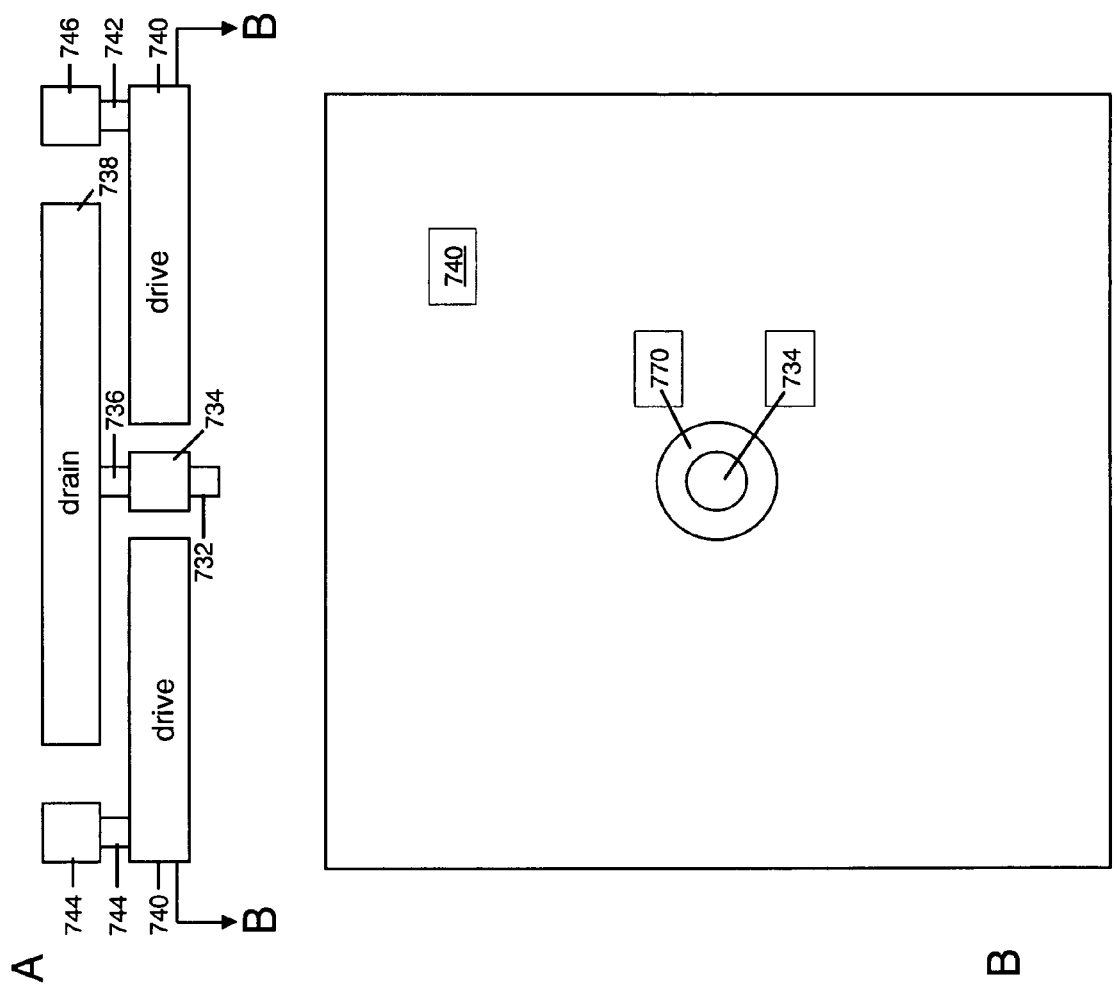
FIGS. 7A and B show a detail of part of the structure of FIG. 6.

FIGS. 7A and B show a detail of part of the structure of FIG. 6. Correspondence between items in FIGS. 6 and 7A is obtained by replacing '6xx' item numbers with '7xx'. FIG. 7B is a cross-section of FIG. 7A at the plane indicated by the arrows labeled "B" in FIG. 7A. In this view it is easy to see that connection 734 passes through hole 770 in drive plate 740. There is no need for hole 770 nor connection 734 to be circular; they could be concentric squares, for example. Furthermore, the connection and hole need not be located in the center of the drive plate. The hole could even be located in a peripheral edge of the drive plate.

Figure 8:
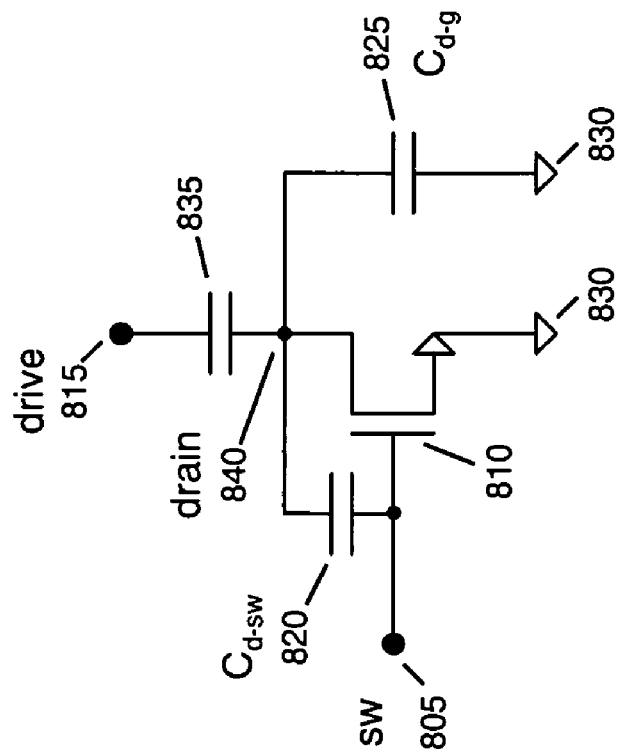
FIG. 8 shows an electrical equivalent schematic diagram of the structure of FIG. 6.

FIG. 8 shows an electrical equivalent schematic diagram of the structure of FIG. 6. The circuit provides a capacitance 835 between a drive node 815 and ground 830. The capacitance is switched by transistor 810 in response to signals applied to switch node 805. Also illustrated in the figure are stray capacitances 820 (between drain 840 and switch 805 nodes) and 825 (between drain 840 and ground 830). In an actual design using a 13 μm by 13 μm unit cell, capacitance 835 was approximately 4 fF while capacitances 820 and 825 were approximately 0.01 fF and 0.05 fF respectively.

Figure 9:
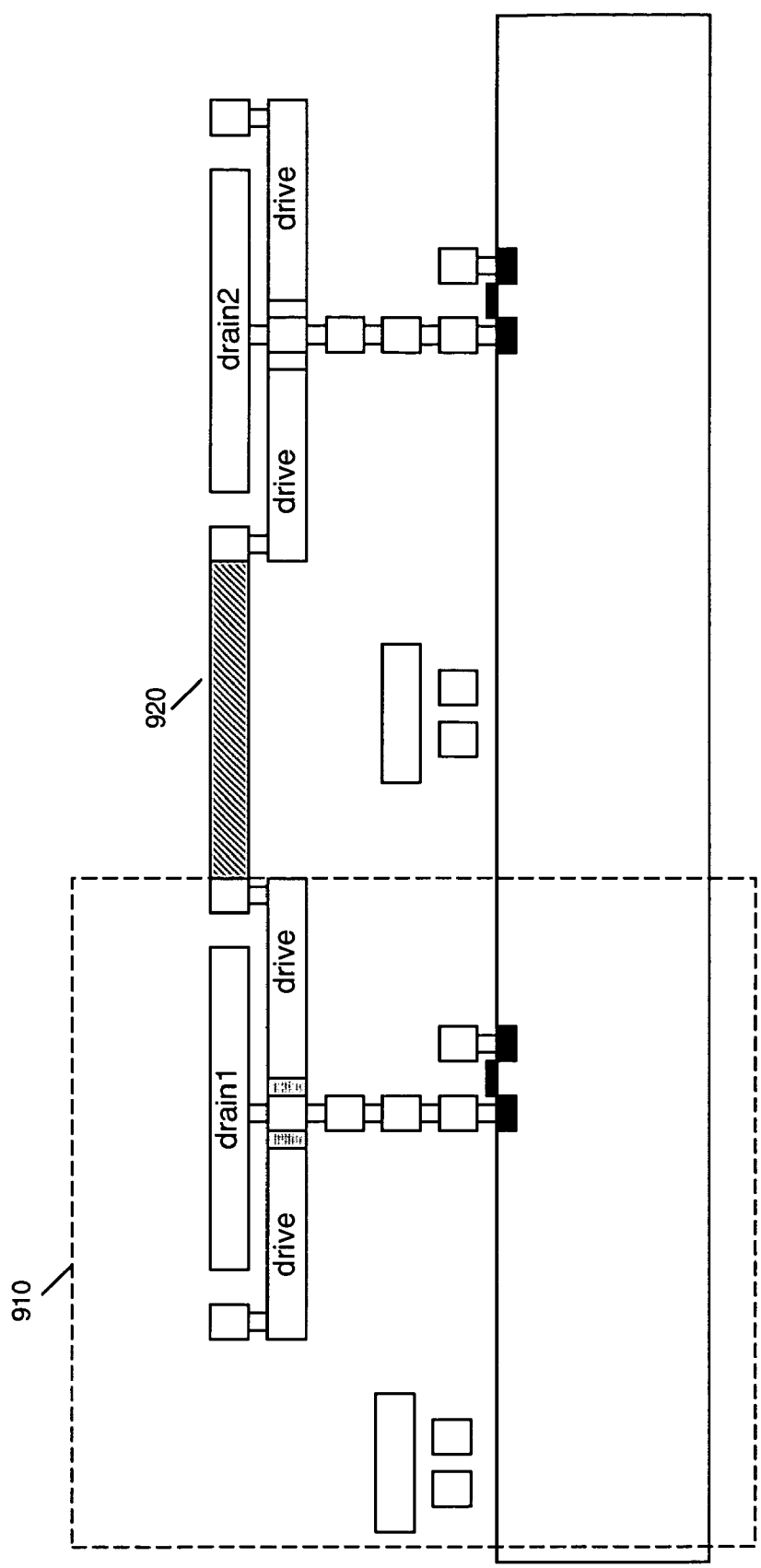
FIG. 9 shows two unit capacitor structures in an array in a cross-section view analogous to that of FIG. 6.

FIG. 9 shows two unit-capacitor structures in an array in a cross-section view analogous to that of FIG. 6. The structures within dotted outline 910 correspond to those illustrated in FIG. 6. Drive plate connection 920 and other similar connections create an array of unit cells at a common drive plate potential. The drive plate and drive plate connection design provides shielding of individual, independent drain plates from each other and from other structures such as signal lines. Signal lines are further shielded by their own grounded shield structures. See item 660 in FIG. 6, for example.

Figure 10:
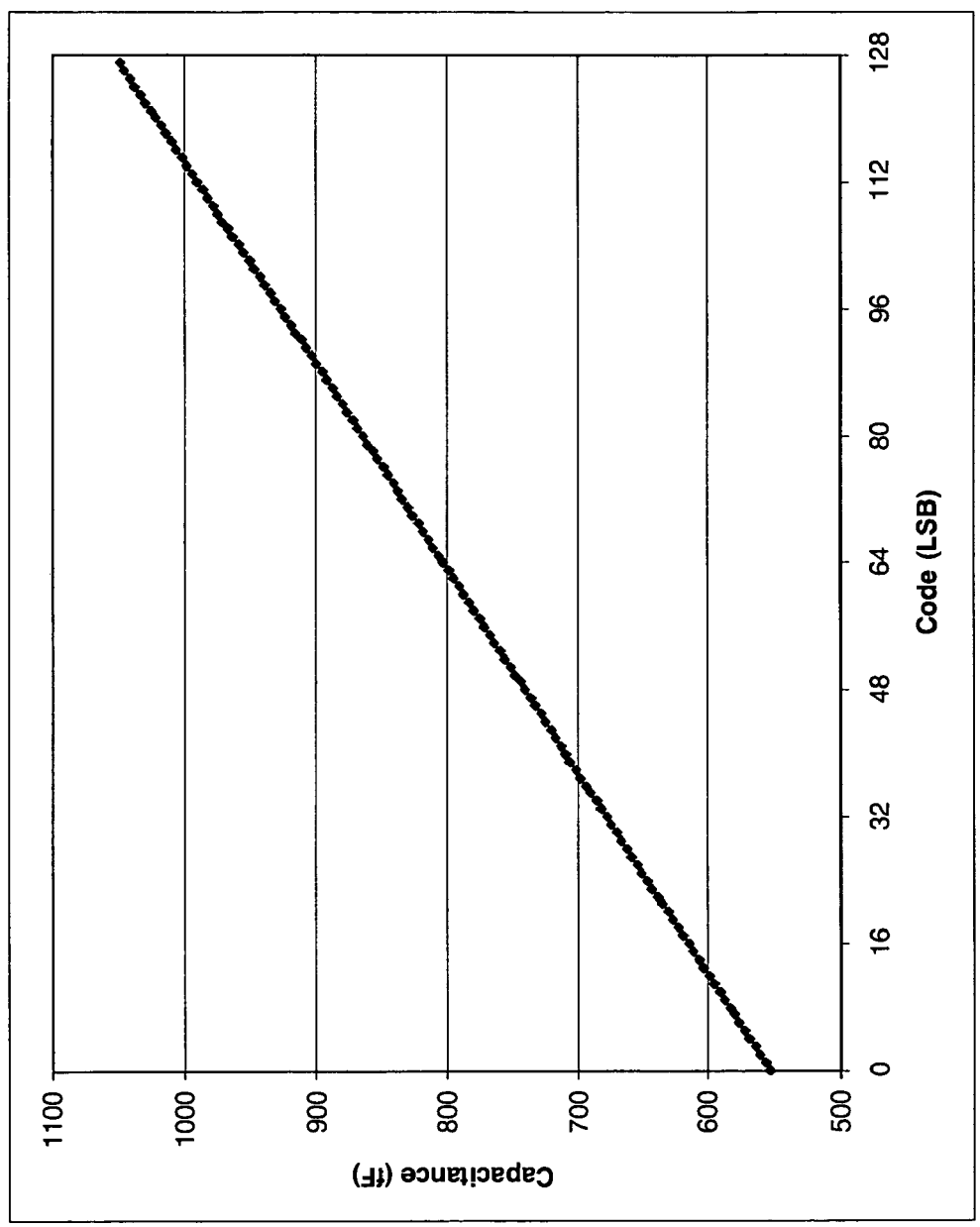
FIG. 10 is a plot of capacitance versus code for a capacitor array.
Figure 11:
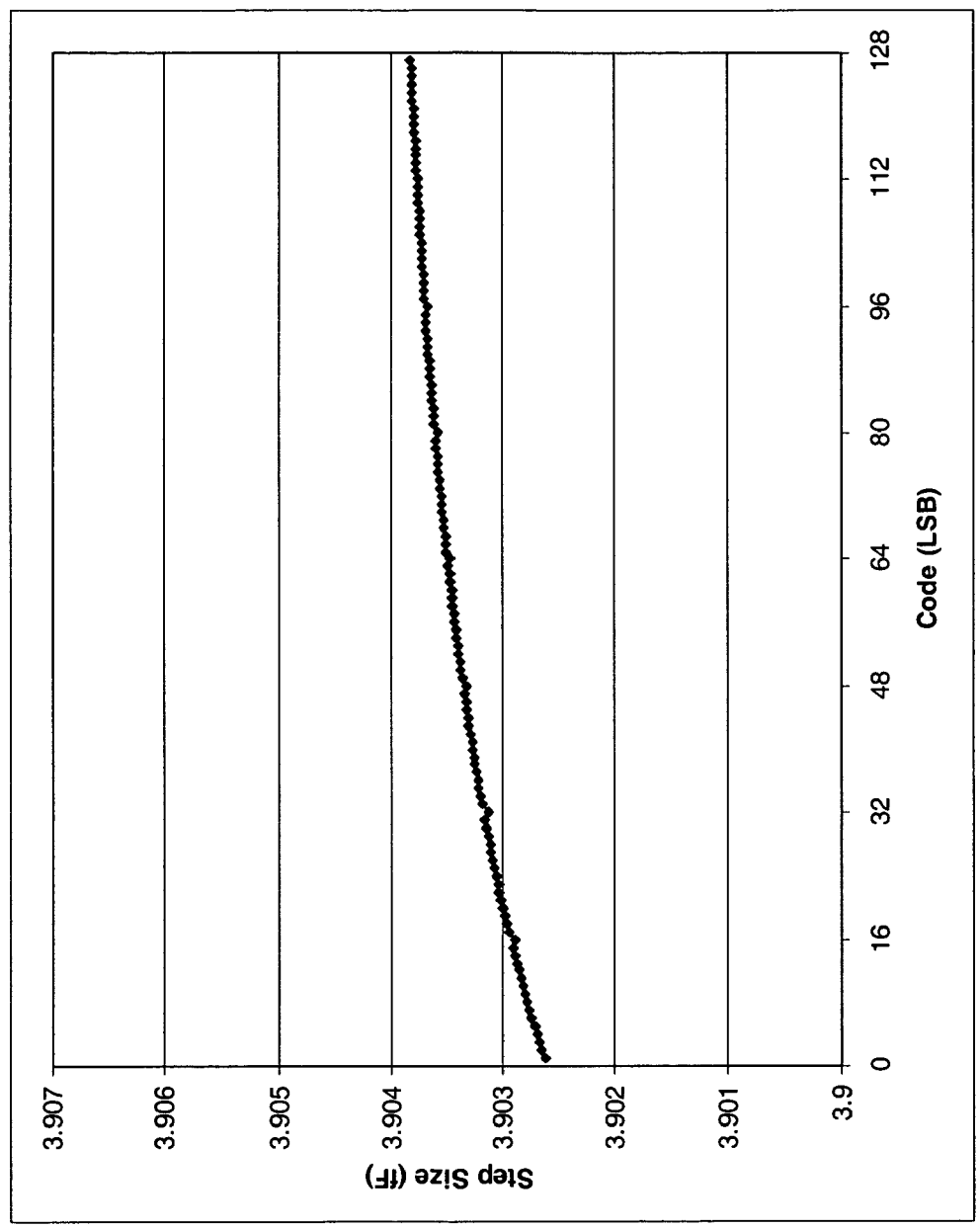
FIG. 11 is a plot of capacitance step versus code for a capacitor array.

FIG. 10 is a plot of capacitance versus code for a capacitor array of the design described in connection with FIGS. 4-9. The capacitance of the array is selectable in 128 steps monotonically increasing from approximately 550 fF to 1050 fF. FIG. 11 is a plot of capacitance step versus code for a capacitor array. The capacitance step size is nearly constant at just over 3.9 fF per step for codes from 0 to 128. The results displayed in FIGS. 10 and 11 show that a digital capacitor array with common-centroid layout, individually shielded unit capacitors, and combination binary—thermometer coded addressing provides precision selectable capacitances that increase monotonically with increasing digital input. Such a capacitor array may be part of a digitally controlled oscillator in a MEMS-based frequency reference.

Figure 12:
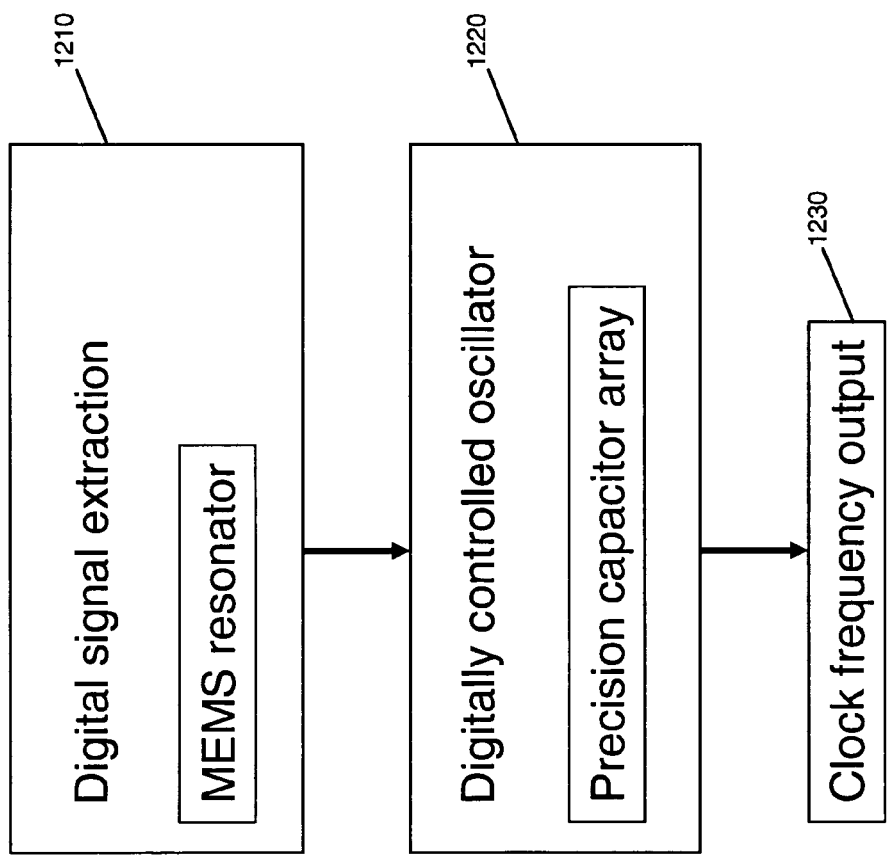
FIG. 12 is a block diagram of a frequency source based on an integrated MEMS resonator.

FIG. 12 is a block diagram of a frequency source based on an integrated MEMS resonator. The frequency source incorporates a digital capacitor array of the design described herein. The frequency source comprises MEMS resonators with digital signal extraction circuits 1210 and a digitally controlled oscillator including a precision capacitor array 1220. The output of the digitally controlled oscillator is a stabilized, precise clock frequency output 1230. Block 1210 includes dual MEMS resonators, temperature correction, digital counters and start-up circuits. Block 1220 includes a precision capacitor array of the type described herein, a digitally controlled oscillator and digital feedback circuits. The capacitor array is part of a relaxation oscillator circuit. Clock frequency output 1230 is a robust replacement for quartz crystal frequency standards in many electronic circuits.

As one skilled in the art will readily appreciate from the disclosure of the embodiments herein, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other systems and methods, not only for the systems and methods described above.

In general, in the following claims, the terms used should not be construed to limit the systems and methods to the specific embodiments disclosed in the specification and the claims, but should be construed to include all systems that operate under the claims. Accordingly, the systems and methods are not limited by the disclosure, but instead the scope of the systems and methods are to be determined entirely by the claims.

What is claimed is:

1. A capacitor array comprising:
a plurality of unit capacitors addressed with a monotonic combination binary-thermometer coded addressing scheme and comprising binary coded capacitor groups and thermometer coded capacitor groups, wherein:
the unit capacitors are arranged in a common-centroid layout;
the binary coded capacitor groups are located closer to the center of the common-centroid layout than the thermometer coded capacitor groups; and
each unit capacitor is electrically shielded from one or more neighbor capacitors.

2. The capacitor array of claim 1 further comprising dummy capacitor groups located farther from the center of the common-centroid layout than are the thermometer coded capacitor groups.

3. The capacitor array of claim 1 wherein each unit capacitor is electrically shielded from array address lines.

4. The capacitor array of claim 3 wherein the array address lines are fabricated in a single process layer.

5. The capacitor array of claim 1 wherein;
the monotonic combination binary-thermometer coded addressing scheme comprises M+N bits; where,
M bits address M binary coded capacitor groups and N bits address $2^N$ thermometer coded capacitor groups; such that,
the capacitance of any single thermometer coded capacitor group is greater than $(2^M-1)$ times the nominal capacitance of a unit capacitor and less than $(2^M+1)$ times the nominal capacitance of a unit capacitor.

6. The capacitor array of claim 1 wherein each unit capacitor comprises first and second capacitor plates wherein an electrical connection to the first capacitor plate is made through a hole in the second capacitor plate.

7. The capacitor array of claim 6 wherein the plates are defined in CMOS metal layers.

8. The capacitor array of claim 6 wherein the second capacitor plate further comprises raised sections to provide shielding from adjacent unit capacitors.

9. The capacitor array of claim 8, wherein the raised sections of each of the plurality of unit capacitors are electrically coupled to the raised sections of their neighbors.

10. The capacitor array of claim 6 wherein each unit capacitor further comprises a third, shielding plate.

11. A frequency reference comprising:
a MEMS resonator with digital signal extraction circuits; and,
a digitally controlled oscillator comprising a capacitor array which comprises a plurality of unit capacitors addressed by a monotonic combination binary—thermometer coded addressing scheme and comprising binary coded capacitor groups and thermometer coded capacitor groups, wherein:
the unit capacitors are arranged in a common-centroid layout,
the binary coded capacitor groups are located closer to the center of the common-centroid layout than the thermometer coded capacitor groups,
each unit capacitor is electrically shielded from one or more neighbor capacitors and from array address lines and,
each unit capacitor comprises two plates wherein an electrical connection to one of the plates is made through a hole in the other.

12. The frequency reference of claim 11 wherein the digital extraction circuits include temperature correction, counting and start-up circuits.

13. A capacitor array comprising:
a plurality of unit capacitors arranged in a common-centroid layout and connected to address lines that connect combinations of capacitors to form an array capacitance according to a digital code, wherein the common-centroid layout comprises binary coded groups of unit capacitors and thermometer coded groups of unit capacitors, wherein:
the binary coded capacitor groups are located closer to the center of the common-centroid layout than the thermometer coded capacitor groups, and the number of bits representing the binary coded capacitor groups is chosen such that a monotonic increase in array capacitance with digital code is achieved.

14. The capacitor array of claim 13 wherein each unit capacitor comprises two plates wherein an electrical connection to one of the plates is made through a hole in the other.

15. The capacitor array of claim 14 wherein each unit capacitor is shielded from its neighbors by raised sections of one of its plates.

16. The capacitor array of claim 13 wherein each unit capacitor is electrically shielded from the address lines.

* * * * *